(12) United States Patent
Suetani et al.

(10) Patent No.: US 10,136,566 B2
(45) Date of Patent: Nov. 20, 2018

(54) ELECTROMAGNETIC SHIELDING MEMBER

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Masaharu Suetani, Mie (JP); Takeshi Shimizu, Mie (JP)

(73) Assignees: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 15/558,313

(22) PCT Filed: Mar. 3, 2016

(86) PCT No.: PCT/JP2016/056538
§ 371 (c)(1),
(2) Date: Sep. 14, 2017

(87) PCT Pub. No.: WO2016/152434
PCT Pub. Date: Sep. 29, 2016

(65) Prior Publication Data
US 2018/0064003 A1    Mar. 1, 2018

(30) Foreign Application Priority Data
Mar. 24, 2015 (JP) .................. 2015-060630

(51) Int. Cl.
| | | |
|---|---|---|
| *H05K 9/00* | (2006.01) | |
| *H02G 3/04* | (2006.01) | |
| *H02G 3/06* | (2006.01) | |

(52) U.S. Cl.
CPC ......... *H05K 9/0018* (2013.01); *H02G 3/0481* (2013.01); *H02G 3/06* (2013.01); *H05K 9/0098* (2013.01)

(58) Field of Classification Search
CPC .................................................. H05K 9/0098
See application file for complete search history.

(56) References Cited

U.S. PATENT DOCUMENTS

| | | | |
|---|---|---|---|
| 7,692,096 B2 * | 4/2010 | Gladd | H05K 9/0098 |
| | | | 174/75 C |
| 8,981,221 B2 * | 3/2015 | Sawada | B60R 16/0215 |
| | | | 174/102 R |

(Continued)

FOREIGN PATENT DOCUMENTS

| | | | | |
|---|---|---|---|---|
| JP | 9182243 A | | 7/1997 | |
| JP | 2010007682 A | | 1/2010 | |
| WO | WO 2015/030011 | * | 3/2015 | ............... H02G 3/22 |

OTHER PUBLICATIONS

International Search Report for application PCT/JP2016/056538 dated May 24, 2016; 4 pages.

*Primary Examiner* — Hung V Ngo
(74) *Attorney, Agent, or Firm* — Reising Ethington, P.C.

(57) ABSTRACT

An electromagnetic shielding member including a first shielding member and a second shielding member where an oxide film on the surface of a connection portion between the first and second shielding members is removed. The electromagnetic shielding member includes the first shielding member that is a flexible tubular metal member, the second shielding member that is harder than the first shielding member and that includes a recess formed in a connect- (Continued)

ing surface that is connected to the first shielding member, and a connecting member that connects the first shielding member and the second shielding member to each other by pressing the first shielding member against the connecting surface of the second shielding member.

5 Claims, 3 Drawing Sheets

(56) References Cited

U.S. PATENT DOCUMENTS

| | | | |
|---|---|---|---|
| 9,272,675 B2* | 3/2016 | Toyama | B60R 16/0215 |
| 9,743,567 B2* | 8/2017 | Itani | H05K 9/0018 |
| 2004/0099427 A1 | 5/2004 | Kihira | |
| 2010/0126752 A1* | 5/2010 | Watanabe | H01B 7/426 |
| | | | 174/102 D |
| 2013/0087377 A1* | 4/2013 | Adachi | H01R 13/648 |
| | | | 174/372 |
| 2013/0306346 A1* | 11/2013 | Izawa | H02G 3/0468 |
| | | | 174/102 R |
| 2016/0137146 A1* | 5/2016 | Yanagihara | H02G 3/22 |
| | | | 174/72 A |
| 2017/0036620 A1* | 2/2017 | Nagahashi | B60R 16/0215 |

* cited by examiner

ELECTROMAGNETIC SHIELDING MEMBER

CROSS REFERENCE TO RELATED APPLICATIONS

This application claims the priority of Japanese patent application JP2015-060630 filed on Mar. 24, 2015, the entire contents of which are incorporated herein.

TECHNICAL FIELD

The present invention relates to an electromagnetic shielding member that shields electromagnetic noise.

BACKGROUND ART

There are cases where a wire harness installed in a vehicle such as an automobile includes an electrical wire to be shielded and an electromagnetic shielding member that covers the electrical wire. The electromagnetic shielding member surrounds the circumference of the electrical wire and shields it from electromagnetic noise.

For example, Patent Document 1 (JP 2006-310127A) discloses an electromagnetic shielding member including a tubular first shielding member and a second shielding member that is more flexible than the first shielding member. Also, in Patent Document 1, a metal pipe is given as the first shielding member, and a tubular braided wire is given as the second shielding member.

SUMMARY

Incidentally, there are cases where an oxide film is formed on the surface of the first shielding member and the second shielding member that are made of metal. At a contact portion between the first shielding member and the second shielding member, if such a film is formed on at least one of the first shielding member and the second shielding member, the contact resistance increases, and thus, there is concern that the shielding performance may deteriorate.

An object of the present design is to suppress an increase in contact resistance and suppress deterioration of the shielding performance of an electromagnetic shielding member including a first shielding member and a second shielding member by removing an oxide film on the surface of a connection portion between the first and second shielding members.

An electromagnetic shielding member according to a first aspect includes a first shielding member that is a flexible tubular metal member, a second shielding member that is harder than the first shielding member and that includes a metal tubular body including a recess formed in a connecting surface that is connected to the first shielding member, and a connecting member that connects the first shielding member and the second shielding member to each other in a state in which the connecting member presses the first shielding member against the connecting surface of the second shielding member and in a state in which, at a portion where the first shielding member abuts against an edge portion of the recess formed in the connecting surface of the second shielding member, an oxide film on a surface of the first shielding member or the second shielding member or on surfaces of both of the first and second shielding member is removed.

An electromagnetic shielding member according to a second aspect is a form of the electromagnetic shielding member according to the first aspect. In the electromagnetic shielding member according to the second aspect, the first shielding member and the tubular body of the second shielding member are members made of the same kind of metal.

An electromagnetic shielding member according to a third aspect is a form of the electromagnetic shielding member according to the first or second aspect. In the electromagnetic shielding member according to the third aspect, an edge portion at a leading end of the recess is angled.

An electromagnetic shielding member according to a fourth aspect is a form of the electromagnetic shielding member according to any one of the first to third aspects. In the electromagnetic shielding member according to the fourth aspect, the recess is continuously formed around the entire circumference of the connecting surface.

An electromagnetic shielding member according to a fifth aspect is a form of the electromagnetic shielding member according to any one of the first to fourth aspects. In the electromagnetic shielding member according to the fifth aspect, a protrusion to be fitted into the recess is formed on a circumferential surface of the connecting member on the first shielding member side thereof.

An electromagnetic shielding member according to a sixth aspect is a form of the electromagnetic shielding member according to any one of the first to fifth aspects. In the electromagnetic shielding member according to the sixth aspect, the second shielding member includes a plurality of the recesses.

An electromagnetic shielding member according to a seventh aspect is a form of the electromagnetic shielding member according to the sixth aspect. In the electromagnetic shielding member according to the seventh aspect, the first shielding member includes a plurality of elemental wires that are assembled into a tubular shape, and the plurality of recesses have a depth that is smaller than an external diameter of the elemental wires.

In the above-described aspects, when the first shielding member is pressed against the second shielding member by the connecting member, the first shielding member comes into contact with the edge portion of the recess formed in the connecting surface of the second shielding member, and thus the surface or the entirety of the first shielding member is stretched. As a result, an oxide film on the surface of the first shielding member or the second shielding member or on the surfaces of both of the first and second shielding members is removed, so that a favorable state of contact can be achieved. In this case, an increase in contact resistance can be suppressed, and deterioration of the shielding performance can be suppressed.

Moreover, in the second aspect, the first shielding member and the tubular body of the second shielding member are members made of the same kind of metal. In this case, dissimilar metal corrosion of a connection portion between the first shielding member and the second shielding member can be suppressed.

Moreover, in the third aspect, the edge portion at the leading end of the recess is angled. In this case, the first shielding member more strongly comes into contact with the edge portion of the recess, and therefore, the oxide film can be removed even more.

Moreover, in the fourth aspect, the recess is continuously formed in the connecting surface around the entire circumference of the tubular body. In this case, a favorable state of contact between the first shielding member and the second shielding member can be achieved in more regions.

Moreover, in the fifth aspect, the protrusion to be fitted into the recess is formed on the circumferential surface of the connecting member on the first shielding member side thereof. In this case, the first shielding member is stretched into a shape that conforms to the protrusion on the circumferential surface of the connecting member, and therefore more strongly abuts against the edge portion of the recess of the second shielding member. Therefore, the oxide film on the surface can be removed even more.

Moreover, in the sixth aspect, the second shielding member includes the plurality of recesses. In this case, the oxide film on the surface can be removed even more.

Moreover, in the seventh aspect, the plurality of recesses have a depth that is smaller than the external diameter of the elemental wires. In this case, the occurrence of a situation in which an elemental wire that has fitted into a recess cannot be pressed against the second shielding member by the connecting member can be suppressed.

DESCRIPTION OF EMBODIMENTS

Hereinafter, embodiments of the present design will be described with reference to the accompanying drawings. The embodiments below are merely examples of embodiments of the present design and are not to be construed as limiting the technical scope of the invention.

First Embodiment

An electromagnetic shielding member 100 according to a first embodiment will be described with reference to FIGS. 1 to 4. The electromagnetic shielding member 100 includes a first shielding member 1 that is a flexible tubular metal member, a second shielding member 2 that is harder than the first shielding member 1, and a connecting member 3 that connects the first shielding member 1 and the second shielding member 2 to each other.

Figure 1:
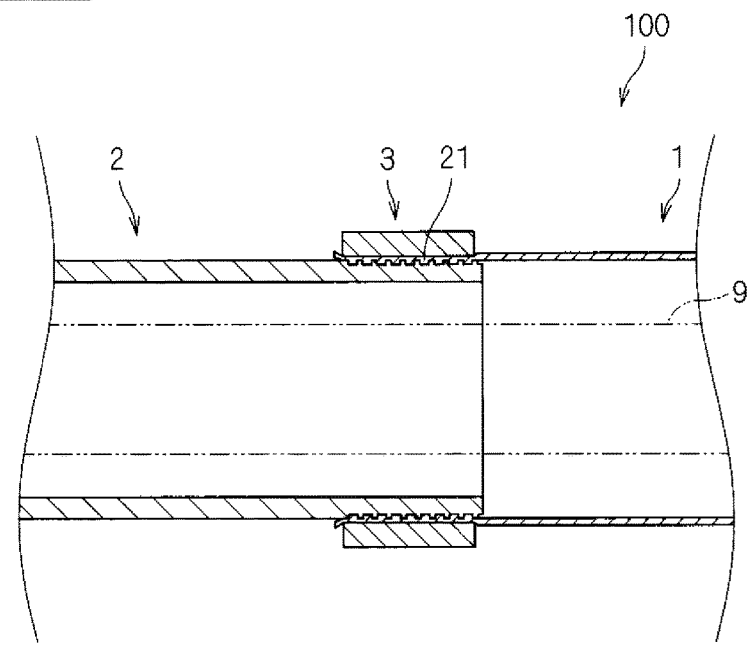
FIG. 1 is a cross-sectional view of an electromagnetic shielding member according to a first embodiment.
Figure 2:
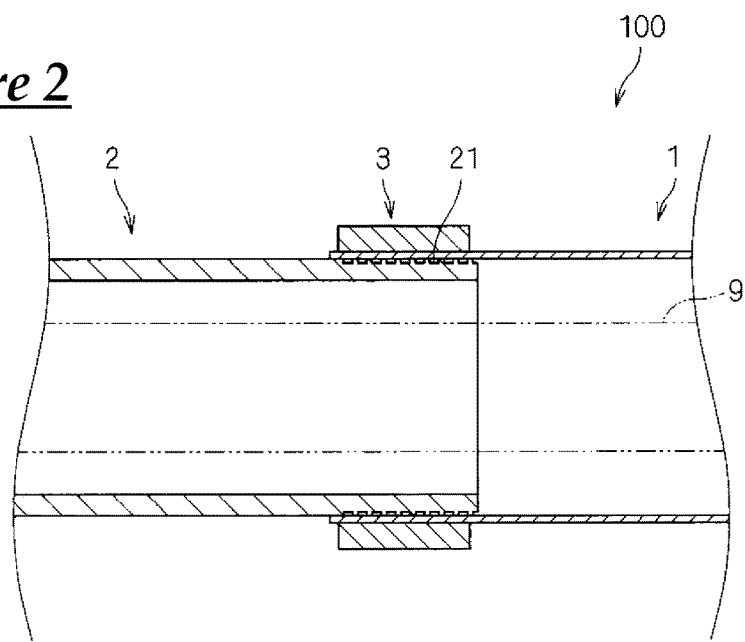
FIG. 2 is a cross-sectional view of the electromagnetic shielding member according to the first embodiment.
Figure 3:
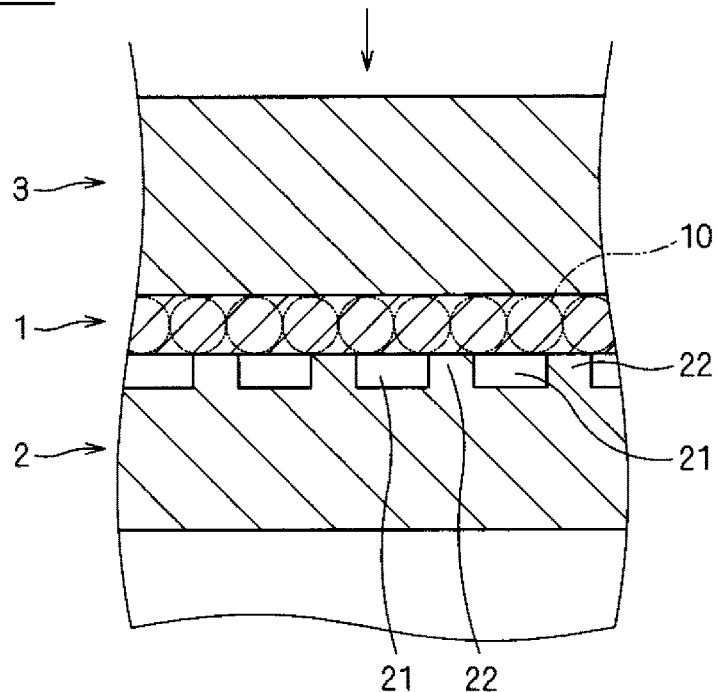
FIG. 3 is a partially enlarged cross-sectional view of the electromagnetic shielding member according to the first embodiment.
Figure 4:
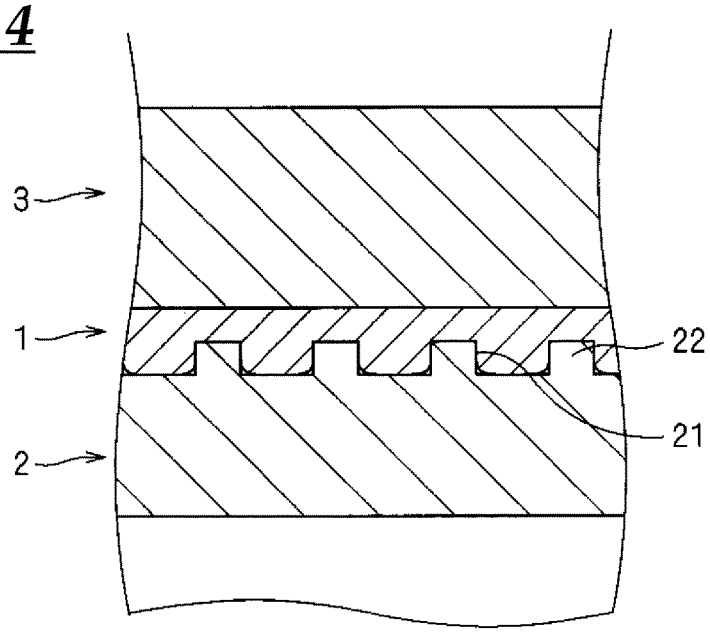
FIG. 4 is a partially enlarged cross-sectional view of the electromagnetic shielding member according to the first embodiment.

FIG. 1 is a cross-sectional view of the electromagnetic shielding member 100 in a state in which the first shielding member 1 and the second shielding member 2 are connected to each other by the connecting member 3. FIG. 2 is a cross-sectional view of the electromagnetic shielding member 100 in a state in which the first shielding member 1 and the second shielding member 2 are not yet connected to each other. FIGS. 3 and 4 are both enlarged views of a connection portion between the first shielding member 1 and the second shielding member 2. FIG. 3 shows a portion of FIG. 2 in an enlarged manner. FIG. 4 shows a portion of FIG. 1 in an enlarged manner.

The electromagnetic shielding member 100 is installed in a vehicle such as an automobile, for example. The electromagnetic shielding member 100 surrounds the circumference of an electrical wire 9 and shields it from electromagnetic noise. For example, it is conceivable that the electrical wire 9 is an insulated electrical wire including a core wire mainly composed of a metal such as copper or aluminum and an insulating coating that covers the circumference of the core wire. The insulating coating is an insulating member made of a resin. Note that, in FIG. 1, the electrical wire 9 is indicated by phantom lines (long- and double short-dashed lines).

First, the first shielding member 1 of the electromagnetic shielding member 100 will be described. The first shielding member 1 is a flexible tubular metal member. Here, a case in which the first shielding member 1 is an aluminum member will be described. In this case, since aluminum is a relatively readily oxidizable metal, an oxide film is likely to develop on the surface thereof.

Note that a case in which the first shielding member 1 is a member made of a metal other than aluminum, for example, copper, and other cases are also conceivable.

In the present embodiment, the first shielding member 1 includes a plurality of elemental wires 10 that are assembled into a tubular shape. For example, a case is conceivable in which the first shielding member 1 is formed into a tubular shape by braiding the plurality of elemental wires 10. Note that a case in which the first shielding member 1 is formed into a tubular shape with the plurality of elemental wires 10 arranged parallel to one another, and other cases are also conceivable.

Next, the second shielding member 2 of the electromagnetic shielding member 100 will be described. The second shielding member 2 includes a metal tubular body and is a member that is harder than the first shielding member 1. Here, a case in which the second shielding member 2 is a metal tubular body, that is, a metal pipe will be described. Note that a case is also conceivable in which the second shielding member 2 includes, in addition to the metal tubular body, a resin layer (insulating layer) formed on the outer circumferential surface thereof. Moreover, it is also possible that, for example, if the resin layer is orange-colored, a worker can be made aware of high voltage or large current.

Moreover, in the present embodiment, the first shielding member 1 and the tubular body of the second shielding member 2 are members made of the same kind of metal. That is to say, the second shielding member 2 herein is an aluminum pipe. When the first shielding member 1 and the second shielding member 2 are members made of the same kind of metal, dissimilar metal corrosion can be suppressed.

In the second shielding member 2, recesses 21 are formed in a connecting surface that is connected to the first shielding member 1. Here, as shown in FIGS. 1 and 2, the first shielding member 1 is connected to the outer circumferential surface side of the second shielding member 2. That is to say, the connecting surface that is connected to the first shielding member 1 is the outer circumferential surface of an end portion of the second shielding member 2. However, a case is also conceivable in which the first shielding member 1 is connected to the inner circumferential surface side of the second shielding member 2. In this case, the connecting surface that is connected to the first shielding member 1 is the inner circumferential surface of an end portion of the second shielding member 2. The recesses 21 will be described later.

Next, the connecting member 3 will be described. The connecting member 3 is a member that connects the first shielding member 1 and the second shielding member 2 to each other by pressing the first shielding member 1 against the connecting surface of the second shielding member 2. Here, as shown in FIGS. 1 and 2, the connecting member 3 is an annular member that surrounds the first shielding member 1.

In the present embodiment, in a state in which a surface of the first shielding member 1 on the inner circumferential side thereof is in contact with the connecting surface of the second shielding member 2, the annular connecting member 3 that is disposed so as to surround the circumference of the first shielding member 1 is crimped. Thus, the first shielding member 1 is strongly pressed against the connecting surface of the second shielding member 2, and the first shielding member 1 and the second shielding member 2 are connected to each other.

The connecting member 3 is, for example, a plastically deformable member capable of maintaining a crimped state. For example, it is conceivable that the connecting member 3 is a member made of a metal having relatively high stiffness. For example, it is conceivable that the connecting member 3 is a member (stainless steel) mainly composed of iron. Moreover, in this case, it is also conceivable that the connecting member 3 is plated with a metal such as tin.

Moreover, for example, it is also conceivable that the difference in standard electrode potential between a metal composing a first layer on a first shielding member 1-side circumferential surface of the connecting member 3 and a metal composing the first shielding member is smaller than the difference in standard electrode potential between a metal composing a second layer, which is a portion other than the first layer, and the metal composing the first shielding member. In this case, corrosion between the first shielding member 1 and the connecting member 3 can be suppressed. Note that the first layer may also be referred to as a plating member.

Moreover, in the present embodiment, the inner circumferential surface of the connecting member 3 is formed as a smooth curved surface. That is to say, protruding portions and the like having a protruding shape are not formed on the inner circumferential surface. However, a case is also conceivable in which a protruding portion is formed on the inner circumferential surface of the connecting member 3. Further details will be described later.

Next, the recesses 21 will be described. In the present embodiment, the recesses 21 are portions that are recessed in the second shielding member 2 on the outer circumferential surface side thereof. Note that it is conceivable that if the first shielding member 1 is connected to the inner circumferential surface side of the second shielding member 2, the recesses 21 are portions that are recessed in the second shielding member 2 on the inner circumferential surface side thereof.

In the present embodiment, the recesses 21 are portions that are brought into contact with the elemental wires 10 of the first shielding member 1 while crimping using the connecting member 3 and that can remove an oxide film on the surfaces of the elemental wires 10. In the electromagnetic shielding member 100, crimping using the connecting member 3 is performed in a state in which the elemental wires 10 are in contact with edge portions of the recesses 21. As a result, the surfaces of the elemental wires 10 are stretched, and the oxide film is removed. Thus, new surfaces are exposed. A favorable connected state can be achieved by bringing the new surfaces into contact with the second shielding member 2.

Moreover, in the present embodiment, the edge portions at leading ends of the recesses 21 are formed to be angled. In this case, the surfaces of the elemental wires 10 are shaved by the angled edge portions at the leading ends of the recesses 21, and thus, the oxide film can be more reliably removed.

Moreover, in the present embodiment, as shown in FIGS. 3 and 4, in a cross-sectional view taken along a cutting plane line along an extending direction of the second shielding member 2, portions (protrusions 22) between the recesses 21 are formed to have a rectangular shape. In this case, prior to being crimped by the connecting member 3, the elemental wires 10 are disposed in contact with flat surfaces at leading ends of the protrusions 22. Then, as a result of crimping using the connecting member 3 in the state in which the elemental wires 10 are disposed on the flat surfaces at the leading ends of the protrusions 22, the elemental wires 10 are stretched and strongly pressed against the edge portions at the leading ends of the recesses 21. Thus, the oxide film on the surfaces of the elemental wires 10 is removed. Note that, in the present embodiment, the protrusions 22 are each a continuous protruding portion that is formed on the connecting surface and that extends around the entire circumference of the second shielding member 2 along the circumferential direction thereof. Moreover, as will be described later, here, a plurality of protrusions 22 are formed on the connecting surface.

Note that, as another aspect, a case is also conceivable in which the protrusions 22, which are the portions between the recesses 21, are formed to have a trapezoidal shape in a cross-sectional view taken along a cutting plane line along the extending direction of the second shielding member 2. Moreover, a case is also conceivable in which the protrusions 22 are formed to have another polygonal shape, such as a triangular shape or a pentagonal shape, in a cross section taken along a cutting plane line along the extending direction of the second shielding member 2.

Moreover, in the present embodiment, the recesses 21 are each continuously formed around the entire circumference of the connecting surface. That is to say, the recesses 21 are each continuously formed along the circumferential direction of the second shielding member 2 and each extend around the entire circumference of the connecting surface. In this case, the oxide film on the surfaces of the elemental wires 10 of the first shielding member 1 can be removed over the entire circumference of the connecting surface.

Note that it is also conceivable that the recesses 21 formed in the connecting surface are formed in a portion of the connecting surface with respect to the circumferential direction of the second shielding member 2. Further details will be described later.

Moreover, in the present embodiment, the second shielding member 2 includes a plurality of recesses 21. Thus, a plurality of protrusions 22 are also formed on the connecting surface. The plurality of recesses 21 are formed side-by-side along the extending direction of the second shielding member 2. In this case, the second shielding member 2 and the first shielding member 1 can be connected to each other over a relatively wide region with respect to the extending direction of the second shielding member 2.

Note that, as another aspect, a case is also conceivable in which one recess 21 is formed helically along the extending direction of the second shielding member 2. Moreover, a case is also conceivable in which a plurality of recesses 21 that are formed in a partial region of the second shielding member 2 with respect to the circumferential direction of the second shielding member 2 are scattered in the circumferential direction of the second shielding member 2.

Moreover, in the present embodiment, a case is conceivable in which the recesses 21 formed in the connecting surface are formed by, for example, performing pressing on a smooth curved connecting surface.

Moreover, in the present embodiment, the recesses 21 are grooves with a depth that is smaller than the external diameter of the elemental wires 10 of the first shielding member 1. In other words, the depth of the protrusions 22 is smaller than the external diameter of the elemental wires 10 of the first shielding member 1. In this case, a situation can be avoided in which, during crimping using the connecting member 3, an entire elemental wire 10 fits into a recess 21, and that elemental wire 10 cannot be pressed against the second shielding member 2 by the connecting member 3.

Moreover, in the present embodiment, as shown in FIGS. 3 and 4, the recesses 21 have a width that is wider than the external diameter of the elemental wires 10 in the extending direction of the second shielding member 2. However, a case is also conceivable in which the recesses 21 are grooves with a width that is narrower than the external diameter of the elemental wires 10. For example, a case in which the recesses 21 are streak-like grooves is also conceivable.

Moreover, in the present embodiment, as shown in FIGS. 3 and 4, the recesses 21 are grooves each formed by three flat faces that are contiguously connected to each other at right angles. However, cases in which the recesses 21 are U-shaped grooves or V-shaped grooves in a cross section taken along a cutting plane line along the extending direction of the second shielding member 2, and other cases are also conceivable.

Next, the electromagnetic shielding member 100 in which the first shielding member 1 and the second shielding member 2 are connected to each other by the connecting member 3 will be described with reference to FIGS. 3 and 4. In the present embodiment, in order to obtain the electromagnetic shielding member 100, first, the first shielding member 1 is placed on the connecting surface, in which the recesses 21 are formed, of the second shielding member 2 so that a portion of the first shielding member 1 on the inner circumferential side thereof comes into contact with the connecting surface of the second shielding member 2. Then, the connecting member 3 prior to being crimped is provided around the circumference of the first shielding member 1 that has been placed on the connecting surface of the second shielding member 2.

In the present embodiment, prior to crimping of the connecting member 3, as shown in FIG. 3, the first shielding member 1 is in contact with the flat surfaces at the leading ends of the protrusions 22 on the connecting surface. That is to say, prior to crimping of the connecting member 3, the elemental wires 10 of the first shielding member 1 are not inserted into the recesses 21 and are located between the inner circumferential surface of the connecting member 3 and the leading ends of the protrusions 22. Note that, in FIG. 3, the elemental wires 10 are indicated by phantom lines (long- and double short-dashed lines).

Then, the first shielding member 1 and the second shielding member 2 are connected to each other as a result of crimping of the connecting member 3. Here, as shown in FIG. 4, as a result of crimping of the connecting member 3, the elemental wires 10 pressed down by the inner circumferential surface of the connecting member 3 are stretched and pushed into the recesses 21 between the protrusions 22.

At this time, the elemental wires 10 come into strong contact with the edge portions at the leading ends of the recesses 21. Here, since the edge portions at the leading ends of the recesses 21 are formed to be angled, the elemental wires 10 relatively strongly come into contact therewith. Thus, the oxide film on the surfaces of the elemental wires 10 is shaved off and removed even more.

Then, in a state in which the operation of crimping the connecting member 3 has been completed, the first shielding member 1 and the second shielding member 2 are connected to each other in a state in which the inner circumferential surface of the connecting member 3 strongly presses the first shielding member 1 against the connecting surface of the second shielding member 2. Note that, here, as shown in FIG. 4, a case in which the first shielding member 1 and the second shielding member 2 are connected to each other by pushing the first shielding member 1 into the recesses 21 is described.

Effects

In the present embodiment, when the first shielding member 1 is pressed against the second shielding member 2 by the connecting member 3, the first shielding member 1 abuts against and is stretched by the edge portions of the recesses 21 that are formed in the connecting surface of the second shielding member 2. Thus, the oxide film on the surface of the first shielding member 1 or the second shielding member 2 or on the surfaces of both of these shielding members is removed, so that a favorable state of contact can be achieved. In this case, an increase in contact resistance can be suppressed, and deterioration of the shielding performance can be suppressed.

Moreover, in the present embodiment, the first shielding member 1 and the second shielding member 2 are members made of the same kind of metal. In this case, dissimilar metal corrosion of the connection portion between the first shielding member 1 and the second shielding member 2 can be suppressed. Therefore, it is also possible to eliminate the necessity for a waterproofing structure, such as a grommet or a rubber boot, that covers the connection portion between the first shielding member 1 and the second shielding member 2. In this case, an increase in the number of components and an increase in the size of the connection portion can be suppressed.

Moreover, in the present embodiment, the edge portions at the leading ends of the recesses 21 are angled. In this case, when the connecting member 3 is crimped, the first shielding member 1 more strongly comes into contact with the edge portions of the recesses 21, so that the oxide film can be removed even more. That is to say, a more favorable state of contact between the first shielding member 1 and the second shielding member 2 can be achieved.

Moreover, in the present embodiment, the recesses 21 are formed in the connecting surface, each extending around the entire circumference of the tubular body (second shielding member 2). In this case, the oxide film on the surface can be removed even more, and a favorable state of contact between the first shielding member 1 and the second shielding member 2 can be achieved in more regions.

Moreover, in the present embodiment, the second shielding member 2 includes the plurality of recesses 21. In this case, the oxide film on the surface can be removed even more, and a favorable state of contact between the first shielding member 1 and the second shielding member 2 can be achieved in more regions.

Moreover, in the present embodiment, the depth of the plurality of recesses 21 is smaller than the external diameter of the elemental wires 10. In this case, a situation in which an entire elemental wire 10 fits into a recess 21 can be avoided. That is to say, a situation in which that elemental wire 10 that has fitted into the recess 21 cannot be pressed against the second shielding member 2 by the connecting member 3 can be suppressed. In this case, the first shielding member 1 can be more strongly pressed against the connecting surface of the second shielding member 2, and therefore, a favorable state of contact can be achieved more reliably.

Moreover, in the present embodiment, the first shielding member 1 is an aluminum member. In this case, an oxide film is likely to develop on the surface of the first shielding member 1. Therefore, the electromagnetic shielding member 100 of the present embodiment is more effective.

Second Embodiment

Figure 5:
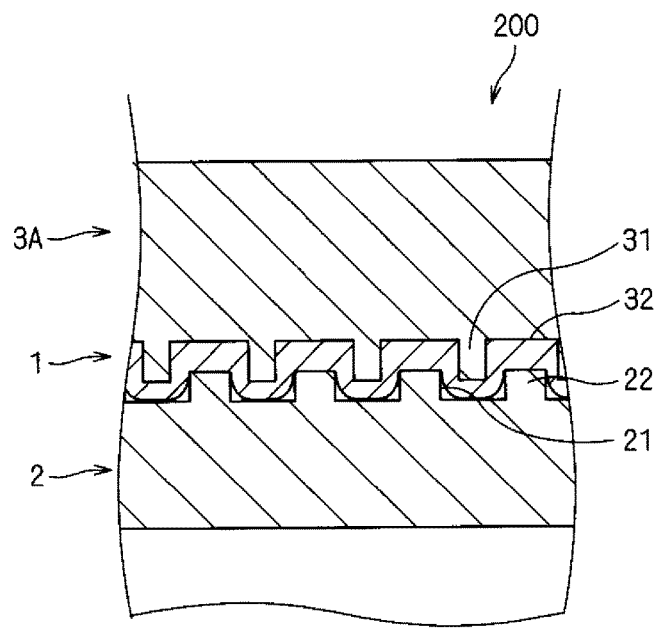
FIG. 5 is a partially enlarged cross-sectional view of an electromagnetic shielding member according to a second embodiment.

Next, an electromagnetic shielding member 200 according to a second embodiment will be described with reference to FIG. 5. The electromagnetic shielding member 200 differs from the first embodiment in that it includes a connecting member 3A with a structure different from that of the connecting member 3. FIG. 5 is a cross-sectional view showing a connection portion between the first shielding member 1 and the second shielding member 2 of the electromagnetic shielding member 200 in an enlarged manner. Note that, in FIG. 5, constituent elements that are the same as those shown in FIGS. 1 to 4 are denoted by the same reference numerals. In the following description, with respect to the present embodiment, differences from the first embodiment will be described.

The electromagnetic shielding member 200 includes the first shielding member 1, the second shielding member 2, and the connecting member 3A. The first shielding member 1 and the second shielding member 2 have the same structures as those of the first embodiment, and therefore, their description is omitted.

In the present embodiment, protrusions 31 to be fitted into the recesses 21 are formed on a circumferential surface (here, inner circumferential surface) of the connecting member 3A on the first shielding member 1 side thereof. That is to say, in the present embodiment, the protrusions 31 protrude from the connecting member 3A on the inner circumferential surface side thereof. Note that, here, a plurality of recesses 21 are formed in the second shielding member 2. Thus, a plurality of protrusions 31 are formed on the inner circumferential surface of the connecting member 3A.

Here, the protrusions 31 are formed on the connecting member 3A such that, when the connecting member 3A is crimped onto the first shielding member 1 and the second shielding member 2, the protrusions 31 coincide with the recesses 21 formed in the second shielding member 2. That is to say, the protrusions 31 are each continuously formed around the entire circumference of the connecting member 3A along the circumferential direction of the connecting member 3A.

Moreover, in the present embodiment, groove portions 32 that are separated from each other by the protrusions 31 are formed in the connecting member 3A. The groove portions 32 are formed to be recessed in the connecting member 3A on the inner circumferential surface side thereof. Here, in a state in which the connecting member 3A has been crimped onto the first shielding member 1 and the second shielding member 2, the protrusions 22 are accommodated in the respective groove portions 32.

In the electromagnetic shielding member 200, during crimping of the connecting member 3A, the protrusions 31 that are formed on the inner circumferential surface of the connecting member 3A cause the elemental wires 10 to be stretched into a shape that conforms to the protrusions 31 on the inner circumferential surface of the connecting member 3, and thus, the elemental wires 10 more strongly come into contact with the edge portions of the recesses 21. As a result, the elemental wires 10 of the first shielding member 1 can be more efficiently pushed into the recesses 21. Therefore, the oxide film on the surface can be removed even more.

In the present embodiment as well, the first shielding member 1 and the second shielding member 2 can be connected to each other in a state in which the oxide film on the surface of at least one of the first shielding member 1 and the second shielding member 2 has been removed, and a favorable state of contact can be achieved. In this case, an increase in contact resistance can be suppressed, and deterioration of the shielding performance can be suppressed.

Third Embodiment

Figure 6:
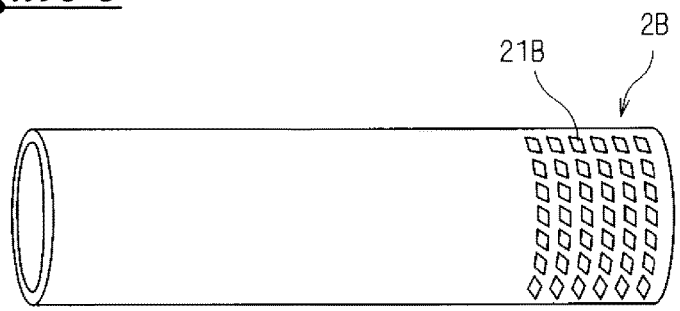
FIG. 6 is a side perspective view of an electromagnetic shielding member according to a third embodiment.
Figure 7:
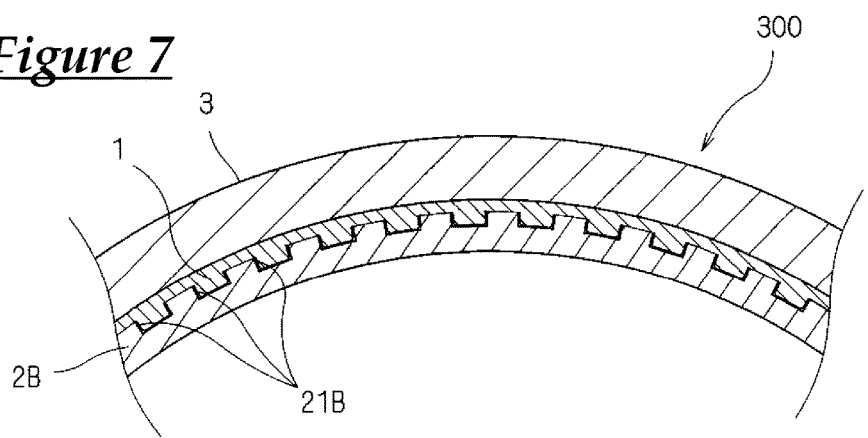
FIG. 7 is a partially enlarged cross-sectional view of the electromagnetic shielding member according to the third embodiment.

Next, an electromagnetic shielding member 300 according to a third embodiment will be described with reference to FIGS. 6 and 7. The electromagnetic shielding member 300 differs from the first embodiment and the second embodiment in that it includes a second shielding member 2B with a structure different from that of the second shielding member 2. FIG. 6 is a side perspective view of the second shielding member 2B. FIG. 7 is an enlarged cross-sectional view showing a connection portion between the first shielding member 1 and the second shielding member 2B of the electromagnetic shielding member 300. The cross-sectional view in FIG. 7 is taken along a cutting plane line along a direction that is orthogonal to the extending direction of the second shielding member 2. Note that, in FIGS. 6 and 7, constituent elements that are the same as those shown in FIGS. 1 to 5 are denoted by the same reference numerals. In the following description, with respect to the present embodiment, differences from the first embodiment and the second embodiment will be described.

The electromagnetic shielding member 300 includes the first shielding member 1, the second shielding member 2B, and the connecting member 3. The first shielding member 1 and the connecting member 3 have the same structures as those of the first embodiment, and therefore, their description is omitted.

In the present embodiment as well, the first shielding member 1 is connected to the outer circumferential surface side of the second shielding member 2B. That is to say, the connecting surface that is connected to the first shielding member 1 is the outer circumferential surface of an end portion of the second shielding member 2B. In addition, in the present embodiment, recesses 21B having a structure different from that of the recesses 21 are formed in the connecting surface of the second shielding member 2B.

As shown in FIG. 6, in the present embodiment, the recesses 21B are depressions that are recessed from the outer circumferential surface side toward the inner circumferential surface side of the second shielding member 2B. A plurality of recesses 21B are formed in the connecting surface. Here, as shown in FIGS. 6 and 7, the plurality of recesses 21B are aligned along the circumferential direction of the second shielding member 2B.

Here, a plurality of recesses 21B that are aligned along the circumferential direction of the second shielding member 2B are referred to as a set of recesses 21B. At this time, in the present embodiment, as shown in FIGS. 6 and 7, a plurality of sets of recesses 21B are arranged side-by-side along the extending direction of the second shielding member 2B.

Note that, with respect to a single set of recesses 21B, a case in which the plurality of recesses 21B are aligned at regular intervals and a case in which the plurality of recesses 21B are irregularly aligned are conceivable.

Moreover, it is also conceivable that a plurality of recesses 21B are irregularly scattered on the connecting surface of the second shielding member 2B.

Moreover, in the present embodiment, as shown in FIG. 6, the recesses 21B are depressions that are formed into a rectangular shape. However, a case is also conceivable in which the recesses 21B are depressions having a round shape or a quadrangular shape with rounded corners. Moreover, a case in which the recesses 21B are depressions having a polygonal shape other than a rectangular shape is also conceivable.

Moreover, it is conceivable that the recesses 21B are formed through pressing, for example.

In the present embodiment as well, in the state in which a surface of the first shielding member 1 on the inner circumferential side thereof is in contact with the connecting surface of the second shielding member 2, the annular connecting member 3 that is disposed so as to surround the circumference of the first shielding member 1 is crimped. At this time, the elemental wires 10 of the first shielding member 1 are crimped by the connecting member 3 in a state in which the elemental wires 10 are in contact with the edge portions of the recesses 21B. Thus, the surfaces of the elemental wires 10 are stretched, and the oxide film is removed. As a result, new surfaces are exposed. Then, a favorable connected state can be achieved by bringing the new surfaces into contact with the second shielding member 2B.

As described above, in the present embodiment as well, when the first shielding member 1 is pressed against the second shielding member 2B by the connecting member 3, the first shielding member 1 abuts against and is stretched by the edge portions of the recesses 21B formed in the connecting surface of the second shielding member 2B. Thus, the oxide film on the surface of the first shielding member 1 or the second shielding member 2B or on the surfaces of both of these shielding members is removed, so that a favorable state of contact can be achieved. In this case, an increase in contact resistance can be suppressed, and deterioration of the shielding performance can be suppressed.

Moreover, in the present embodiment, since the plurality of recesses 21B are aligned in the circumferential direction of the second shielding member 2B, the number of edge portions of recesses 21B that can come into contact with the elemental wires 10 of the first shielding member 1 can be increased.

Note that, instead of the connecting member 3 of the third embodiment, the connecting member 3A of the second embodiment may also be adopted. In this case, the protrusions 31 of the connecting member 3A are formed at such positions and into such a shape that the protrusions 31 can be accommodated in the respective recesses 21B that are scattered in the circumferential direction of the second shielding member 2B.

Application Examples

A case is also conceivable in which the recesses 21 are formed in the connecting surface of the second shielding member 2 through sandblasting. In this case, protrusions and recesses are formed on the connecting surface by spraying an abrasive onto the connecting surface. That is to say, the connecting surface is roughened. Here, in an enlarged view of the connecting surface, portions that have a recessed shape constitute the recesses 21, and portions that have a protruding shape around the recesses 21 constitute the protrusions 22.

Moreover, a case is also conceivable in which the connecting member 3 is a member that is softer than the first shielding member 1, for example, a member made of a resin. In this case, the first shielding member 1 is pressed against the second shielding member 2 while the connecting member 3 itself deforms, and thus, the first shielding member 1 and the second shielding member 2 are connected to each other.

Note that an electromagnetic shielding member according to the present invention can also be configured by freely combining the embodiments and application examples that have been described above or by appropriately modifying, or omitting a portion of, the embodiments and application examples, without departing from the scope of the invention as defined in the claims.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

LIST OF REFERENCE NUMERALS

1 First shielding member
10 Elemental wire
100 Electromagnetic shielding member
2 Second shielding member
21 Recess
3 Connecting member
31 Protrusion

The invention claimed is:
1. An electromagnetic shielding member comprising:
a first shielding member that is a flexible tubular metal member;
a second shielding member that is harder than the first shielding member and that includes a metal tubular body including a plurality of recesses formed in a connecting surface that is connected to the first shielding member; and a connecting member that connects the first shielding member and the second shielding member to each other in a state in which the connecting member presses the first shielding member against the connecting surface of the second shielding member and in a state in which, at a portion where the first shielding member abuts against an edge portion of the plurality of recesses formed in the connecting surface of the second shielding member, an oxide film on a surface of the first shielding member or the second shielding member or on surfaces of both of the first and second shielding members is removed;

wherein the first shielding member includes a plurality of elemental wires that are assembled into a tubular shape, and the plurality of recesses have a depth that is smaller than an external diameter of the elemental wires.

2. The electromagnetic shielding member according to claim 1, wherein the first shielding member and the tubular body of the second shielding member are members made of the same kind of metal.

3. The electromagnetic shielding member according to claim 1, wherein one or more of the plurality of edge portions at a leading end of the recess is angled.

4. The electromagnetic shielding member according to claim 1, wherein the plurality of recesses are continuously formed around the entire circumference of the connecting surface.

5. The electromagnetic shielding member according to claim 1, wherein a protrusion to be fitted into the recess is formed on a circumferential surface of the connecting member on the first shielding member side thereof.

* * * * *